United States Patent
Tsuji

(10) Patent No.: US 7,595,238 B2
(45) Date of Patent: Sep. 29, 2009

(54) TRENCH MOS TYPE SILICON CARBIDE SEMICONDUCTOR DEVICE AND METHOD FOR MANUFACTURING THE SAME

(75) Inventor: Takashi Tsuji, Matsumoto (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 154 days.

(21) Appl. No.: 11/775,123

(22) Filed: Jul. 9, 2007

(65) Prior Publication Data
US 2008/0012026 A1    Jan. 17, 2008

(30) Foreign Application Priority Data
Jul. 10, 2006    (JP)    ............. 2006-188804

(51) Int. Cl.
*H01L 21/336*    (2006.01)
(52) U.S. Cl. ................ 438/259; 257/E29.141
(58) Field of Classification Search .......... 257/E29.149; 438/259
See application file for complete search history.

(56) References Cited

U.S. PATENT DOCUMENTS

| 6,342,709 B1 | 1/2002 | Sugawara et al. |
| 2003/0042538 A1 | 3/2003 | Kumar et al. |
| 2003/0178672 A1 | 9/2003 | Hatakeyama et al. |
| 2005/0029557 A1 | 2/2005 | Hatakeyama et al. |
| 2005/0029558 A1 | 2/2005 | Hatakeyama et al. |
| 2006/0060884 A1 | 3/2006 | Ohyanagi et al. |
| 2006/0226504 A1 | 10/2006 | Hatakeyama et al. |

FOREIGN PATENT DOCUMENTS

| DE | 10312911(B4) | * 10/2004 |
| JP | 10-98188 | 4/1998 |
| JP | 2004-6723 | 1/2004 |
| JP | 3711906 | 11/2005 |
| JP | 2006-93186 | 4/2006 |

OTHER PUBLICATIONS

High-Voltage Accumulation-Layer UMOSFET's in 4H-SiC, J.Tan, J. A. Cooper, Jr., Fellow, IEEE, and M. R. Melloch, Senior Member, IEEE, *IEEE Electron Device Letters*, vol. 19, No. 12, Dec. 1998.

* cited by examiner

*Primary Examiner*—David S Blum
(74) *Attorney, Agent, or Firm*—Rabin & Berdo, P.C.

(57) ABSTRACT

A trench MOS type SiC semiconductor device includes a first conductivity semiconductor substrate, a first conductivity drift layer on the substrate, a second conductivity base layer on the drift layer, a first conductivity source layer on the base layer, a stripe shaped trench reaching from the surface of the source layer to the drift layer and having a gate electrode via a gate oxide film, a second conductivity layer on the bottom of the trench, and a second conductivity type region thereon on across-the-width side walls of at least one end of the trench, electrically coupling the second conductivity layer with the base layer. The device and method for manufacturing the same allow a low on-resistance without newly forming an electrode connected to the second conductivity layer even in the case of a device in which the second conductivity layer has to be grounded.

4 Claims, 16 Drawing Sheets

TRENCH MOS TYPE SILICON CARBIDE SEMICONDUCTOR DEVICE AND METHOD FOR MANUFACTURING THE SAME

BACKGROUND OF THE INVENTION

1. Field of the Invention

The present invention relates to silicon carbide (hereinafter referred to as SiC) semiconductor device that uses SiC as a semiconductor material, in particular, a voltage driven-type (MOS type power) SiC semiconductor device having a trench gate structure such as a Metal Oxide Semiconductor Field Effect Transistor (hereinafter referred to as MOSFET) or an Insulated Gate Bipolar Transistor (hereinafter referred to as IGBT), and a method for manufacturing the same.

2. Related Art

A SiC semiconductor material has high insulation breakdown field strength because the SiC semiconductor material has a large band gap in comparison with a silicon semiconductor material. An on-resistance is a resistance when a semiconductor device is in conduction. For example, an on-resistance of the SiC semiconductor device referred to as 4H type that is widely used can be suppressed to a several hundredth part of an on-resistance of a silicon semiconductor device because the on-resistance is in inverse proportion to the third power of the insulation breakdown field strength.

Further, the SiC semiconductor device also has a large specific thermal conductivity characteristic that makes it easy to radiate heat. Therefore, the SiC semiconductor device is highly expected to be used as a low-loss power semiconductor device for the next generation. In recent years, the quality of SiC wafers (semiconductor substrate) has improved and also SiC wafers having a large diameter have been developed, and thus there has been active development of SiC semiconductor devices such as MOSFETs, Bipolar Transistors and Junction type Field Effect Transistors (JFETs) in which the characteristics of the SiC semiconductor devices exceed those of the silicon semiconductor devices substantially. MOSFETs especially have a feature of high speed switching in comparison with bipolar devices in which both electrons and holes contribute to conduction, because MOSFETs not only have lower cost gate driving circuits due to being voltage driven devices but also allow charge carriers to be swept out of the device without needing a swept time in a turn-off state, due to being majority carrier devices with only electrons or holes in which there is no storage of the carrier in conduction.

FIG. 9 illustrates a cross-sectional structure of a unit cell of a conventional and generic vertical-trench U-shape Metal Oxide Semiconductor Field Effect Transistor (hereinafter referred to as a conventional and generic UMOSFET). After sequentially forming a high-resistance n-type drift layer 22 and a p-type base layer 23 on a low-resistance n-type SiC semiconductor substrate (a drain layer) 21 by epitaxial SiC growth, an n$^+$-type source region 24 is formed by ion implantation into the surface of the p-type base layer 23. A gate trench 25 is formed in such a SiC wafer 30. A gate oxide film 26, a gate electrode 27, a source/base electrode 28 and a drain electrode 29 are formed sequentially, and the wafer is completed.

In an off-state where the source/base electrode 28 is grounded and a large enough negative bias is applied to the gate electrode 27 for the off-state, holes are induced and stored in a region of the base layer 23 adjacent to an interface between the gate oxide film 26 and the base layer 23 interposed between the source region 24 and the drift layer 22. Thus, no current flows, because a pathway of electrons being employed as a conduction carrier is interrupted. When a positive high voltage is applied to the drain electrode 29, depletion layers are spread in both the base layer 23 and the drift layer 22, and the high voltage is maintained in a suppressed low leakage current-state because a junction between the base layer 23 and the drift layer 22 is in a reverse bias-state.

In an on-state where a positive bias large enough for the on-state is applied to the gate electrode 27, electrons are induced in the region (an inversion layer) of the base layer 23 adjacent to an interface between the gate oxide film 26 and the base layer 23 interposed between the source region 24 and the drift layer 22. Electrons employed as a conduction carrier flow sequentially between the source/base electrode 28, the source region 24, the inversion layer (not illustrated), the drift layer 22, the substrate 21 and the drain electrode 29.

Regarding a resistance in the on-state, a generic Double-Implanted Metal Oxide Semiconductor Field Effect Transistor (hereinafter referred to as a general DIMOSFET) shown in FIG. 10 has two resistances structurally added, that is, the first resistance is an accumulation one, in that electrons move over a neighborhood of an interface between a drift layer 32 and a gate oxide film 36, and the second resistance is a JFET one that occurs readily due to the drift layer 32 that is interposed between the base layers 33 of both sides when electrons flow from a neighborhood of the gate oxide film 336 in the drift layer 32 towards a drain layer beneath the drift layer 32. However, the conventional and generic UMOSFET shown in FIG. 9 has a feature whereby these two resistances do not occur. Therefore, when a pitch of unit cells is reduced in the generic DIMOSFET, the JFET resistance appears if the pitch of the unit cells is a critical distance or greater, and the on-resistance increases. On the other hand, the conventional and generic UMOSFET has a feature such that the on-resistance monotonically decreases as the pitch of unit cells becomes smaller. Especially, because it is necessary to reduce the pitch of unit cells by microfabrication for a MOSFET having a breakdown voltage of less than about 3 kV, due to a MOS channel resistance that cannot be ignored, it is preferable to use a vertical trench UMOSFET.

FIG. 11 shows a cross-sectional view showing a structure of a conventional and generic UMOSFET and electric field strength distribution diagrams showing the electric field strength in an off-state in a horizontal axis and a thickness direction of the substrate in a longitudinal axis in correspondence with this cross-sectional view regarding a PN junction part and a MOS structure part, each indicated in outline by a broken line. As can be seen from FIG. 11, the electric field strength applied to the oxide film (the SiO$_2$ film) 26 on the bottom of the trench is very large. This depends on a difference between the relative permittivity (9.7 in the case of 4H-SiC) of SiC and the relative permittivity (3.8) of a SiO$_2$ film. Further, the electric field strength applied to the oxide film at the corners of the trench becomes higher than that applied to the oxide film at the bottom of the trench due to the electric field concentration, although this is not illustrated in FIG. 11. Ideally, breakdown is caused in the SiC semiconductor device when the peak electric field strength of a p-n junction between the p-type base layer 23 and the n-type drift layer 22 shown in FIG. 11 reaches the insulation breakdown electric field strength of SiC. However, in the case of the conventional and generic UMOSFET, the oxide film (the SiO$_2$ film) 26 at the bottom of the trench reaches the insulation breakdown electric field strength (about 10 MV/cm) before the peak electric field strength of the p-n junction between the base layer 23 and the drift layer 22 reaches the insulation breakdown electric field strength. Thus, there is a problem in that insulation breakdown in the conventional and generic UMOSFET is caused at a lower voltage than the theoretical breakdown voltage. Because the insulation breakdown electric field strength of a silicon semiconductor is 0.2 MV/cm that is two orders of magnitude smaller than that of the oxide film (the $SiO_2$ film) of 10 MV/cm, the insulation breakdown of the silicon semiconductor is caused approximately in the p-n junction. However, because the insulation breakdown electric field strength of the SiC semiconductor (in the case of 4H—SiC) is 2 MV/cm, which is larger than that of the silicon semiconductor and that of the 4H—SiC semiconductor is only one order of magnitude different from that of the oxide film (the $SiO_2$ film), a problem of the insulation breakdown of the oxide film (the $SiO_2$ film) becomes significant.

For example, as one method of countermeasure for such a problem, J. Tan et al., IEEE Electron Dev. Lett., Vol. 19, p. 487- (1998) discloses that an aluminum or a boron ion implantation is carried out to the entire surface of an element using a mask just after forming a trench and then a UMOSFET is manufactured through a process of forming a $p^+$ layer on only the bottom of the trench in which an impurity concentration is about $1 \times 10^{18}$ cm$^{-3}$ and a thickness is about 0.5 μm. Whereby, regarding an electric field strength distribution in a cross section perpendicular to the bottom of the trench, the very large electric field is absorbed by the $p^+$ layer (an electric field relaxation layer) 40 on the bottom of the trench and the very large electric field is not applied to a oxide film (the $SiO_2$ film) 26 as shown in FIG. 12 in spite of the very large electric field strength being applied to the oxide film (the $SiO_2$ film) 26 in a conventional and generic structure as shown in FIG. 11. Thus, an improvement in breakdown voltage is realized by preventing the insulation breakdown in the oxide film (the $SiO_2$ film) 26.

Japanese Patent No. 3711906 discloses a SiC semiconductor device where a $p^+$ layer is formed along an inside surface of a trench and a surge-absorbing diode is formed thereby. In addition, Japanese Patent Laid-Open No. 2006-93186 discloses a SiC semiconductor device where a $p^{++}$ contact layer of gate regions is formed on the bottom of a trench along an inner surface of the trench and whereby a voltage from outside can be supplied, so that a gate resistance is reduced and high speed switching operation becomes possible. Further, Japanese Patent Laid-Open No. 2004-6723 discloses a high breakdown voltage SiC semiconductor device where an excellent switch-off characteristic is obtained by a p-type gate layer formed on the bottom of a trench. Also, Japanese Patent Laid-Open No. 10-098188 discloses an invention that enables a high breakdown voltage by forming an electric field relaxation layer ($p^+$ layer) of a conductivity type opposite to a drift layer in a drift layer underneath an insulation layer of a trench in a UMOSFET.

However, because the $p^+$ layer on the bottom of the trench has to be grounded in the above Japanese Patent Laid-Open No. 10-098188, it is necessary to form an electrode for the $p^+$ layer to be brought out on the surface. Therefore it is necessary to provide three electrode pads for a gate, a source and the $p^+$ layer on the surface (an element-manufacturing surface). In a usual structure, there are only two electrode pads for the gate and the source on the surface. There is therefore a problem in the above Japanese Patent Laid-Open No. 10-098188 in that an active region in which a current flows in an element decreases due to the increased area of the pad for the $p^+$ layer. Thus, there is a problem in that the on-resistance per unit area increases in the whole of a chip. Further, there is a problem in that more manufacturing steps are required, that is, the number of wire-bonding locations to connect electrodes to an external circuit is increased from two to three.

SUMMARY OF THE INVENTION

The present invention has been made in view of the above problems. An object of the invention is to provide a trench MOS type SiC semiconductor device and method for manufacturing the same that allow an on-resistance to be reduced without newly forming an electrode connected electrically to a trench bottom $p^+$ layer formed on the bottom of the trench even in the case of a SiC semiconductor device having a MOS structure in which the trench bottom $p^+$ layer has to be grounded.

To solve the problems and accomplish the objects of the invention, a trench MOS type SiC semiconductor device according to a first aspect of the invention includes a first conductivity type semiconductor substrate, a first conductivity type drift layer formed on the first conductivity type semiconductor substrate, a second conductivity type base layer formed on the first conductivity type drift layer, a first conductivity type source layer formed on the second conductivity type base layer, a stripe shaped trench reaching from the surface of the first conductivity type source layer to the first conductivity type drift layer and having a gate electrode via a gate oxide film, a second conductivity type layer formed on the bottom of the stripe shaped trench, and a second conductivity type region formed on the second conductivity type layer and formed on across-the-width side walls of at least a first end of the stripe shaped trench, the second conductivity type region electrically coupling the second conductivity type layer with the second conductivity type base layer.

According to a second aspect of the invention, a method for manufacturing a trench MOS type SiC semiconductor device including a first conductivity type semiconductor substrate, a first conductivity type drift layer formed on the first conductivity type semiconductor substrate, a second conductivity type base layer formed on the first conductivity type drift layer, a first conductivity type source layer formed on the second conductivity type base layer, a stripe shaped trench reaching from the surface of the first conductivity type source layer to the first conductivity type drift layer and having a gate electrode via a gate oxide film, a second conductivity type layer formed on the bottom of the stripe shaped trench, and a second conductivity type region formed on the second conductivity type layer and formed on across-the-width side walls of at least a first end of the stripe shaped trench, the second conductivity type region electrically coupling the second conductivity type layer with the second conductivity type base layer, includes the step of forming the second conductivity type region on the second conductivity type layer and on the across-the-width side walls of at least the first end of the stripe shaped trench by an ion implantation of an ion species to electrically couple the second conductivity type layer with the second conductivity type base layer.

In a third aspect of the invention, a method is employed for manufacturing a trench MOS type SiC semiconductor device in which the ion implantation is such that the ion species is implanted in the directions of perpendicularity and tilt to a principal surface of the first conductivity type semiconductor substrate.

In a fourth aspect of the invention, a method is employed for manufacturing a trench MOS type SiC semiconductor device including a first conductivity type semiconductor substrate, a first conductivity type drift layer formed on the first conductivity type semiconductor substrate, a second conductivity type base layer formed on the first conductivity type drift layer, a first conductivity type source layer formed on the second conductivity type base layer, a stripe shaped trench reaching from the surface of the first conductivity type source layer to the first conductivity type drift layer and having a gate electrode via a gate oxide film, a second conductivity type layer formed on the bottom of the stripe shaped trench, and a second conductivity type region formed on the second conductivity type layer and formed on across-the-width side walls of at least a first end of the stripe shaped trench, the second conductivity type region electrically coupling the second conductivity type layer with the second conductivity type base layer, including the step of forming a tantalum carbide (hereinafter referred to as TaC) film used as a mask for selectively forming the second conductivity type region on the second conductivity type layer and on the across-the-width side walls of at least the first end of the stripe shaped trench to electrically couple the second conductivity type layer with the second conductivity type base layer, and the step of forming the second conductivity type region on the second conductivity type layer of the bottom of the stripe shaped trench and on the across-the-width side walls of at least the first end of the stripe shaped trench by growing selectively an epitaxial SiC to electrically couple the second conductivity type layer with the second conductivity type base layer.

In brief, a structure according to the a preferred embodiment of the invention to solve the previously described problems is such that the $p^+$ region formed on the inner surface of the trench electrically couples the trench bottom $p^+$ layer with the p base layer. In one embodiment a manufacturing method is employed where the electrically coupling $p^+$ region is formed by an ion implantation of an acceptor element in the directions of perpendicularity and tilt to the principal surface of the semiconductor substrate to form the $p^+$ region on the trench bottom $p^+$ layer and on the across-the-width side walls of at least a first end of the stripe shaped trench in the MOSFET substrate having the stripe shaped trench. Alternatively, in another embodiment a manufacturing method is employed such that, sequentially, a TaC film is formed on the entire surface of the MOSFET substrate having the stripe shaped trench, the TaC film of only both the bottom of the trench and the across-the-width side walls of at least a first end of the stripe shaped trench are selectively removed, and the electrically coupling $p^+$ region is formed by selectively growing the epitaxial SiC.

Effects of the Invention

According to an embodiment of the invention, the trench MOS type SiC semiconductor device and method for manufacturing the same allow the on-resistance to be reduced without newly forming the electrode electrically connected to a trench bottom $p^+$ layer formed on the bottom of the trench even in the case of a SiC semiconductor device having an MOS structure in which the $p^+$ layer formed on the bottom of the trench has to be grounded.

DETAILED DESCRIPTION OF THE PREFERRED EMBODIMENTS

Preferred embodiments of a semiconductor device and the method for manufacturing the same according to the invention will now be explained in detail with reference to the attached drawings.

Figure 1A:
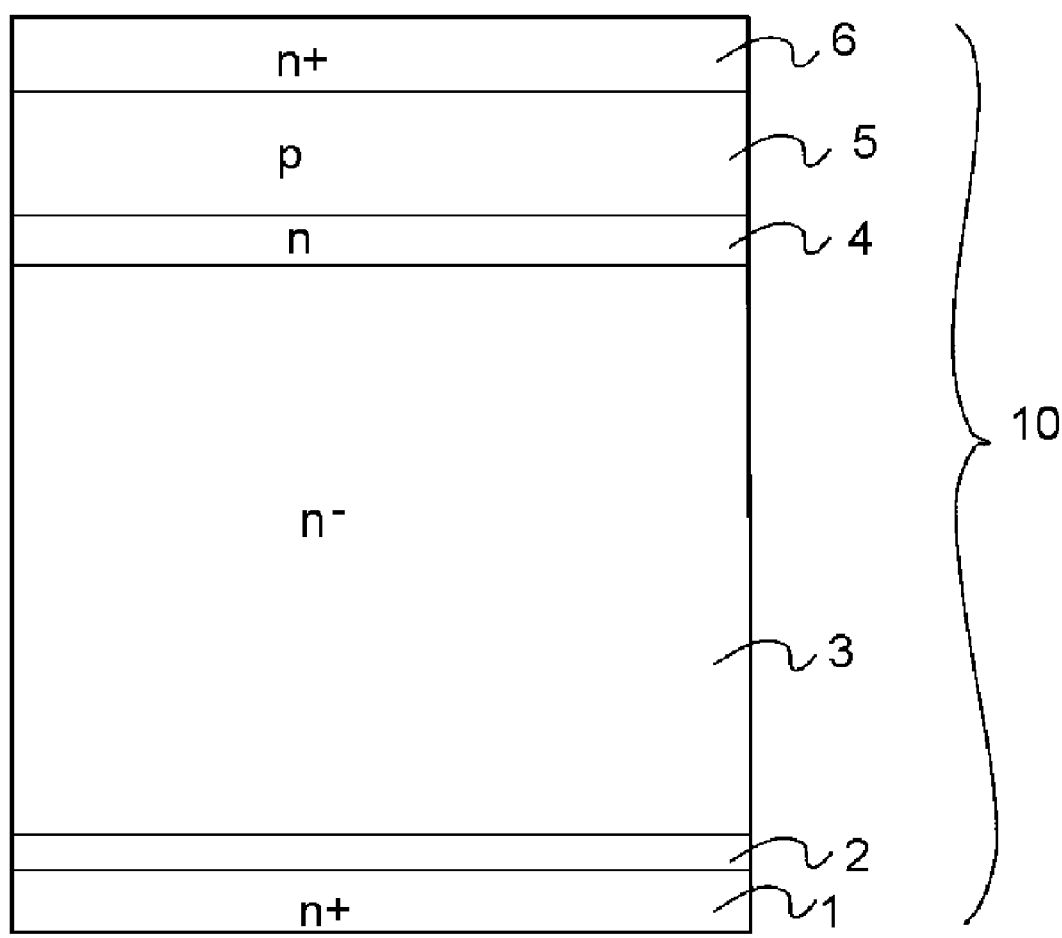
FIG. 1A is a cross-sectional view of a semiconductor substrate showing a method for manufacturing a semiconductor device according to the invention.
Figure 1B:
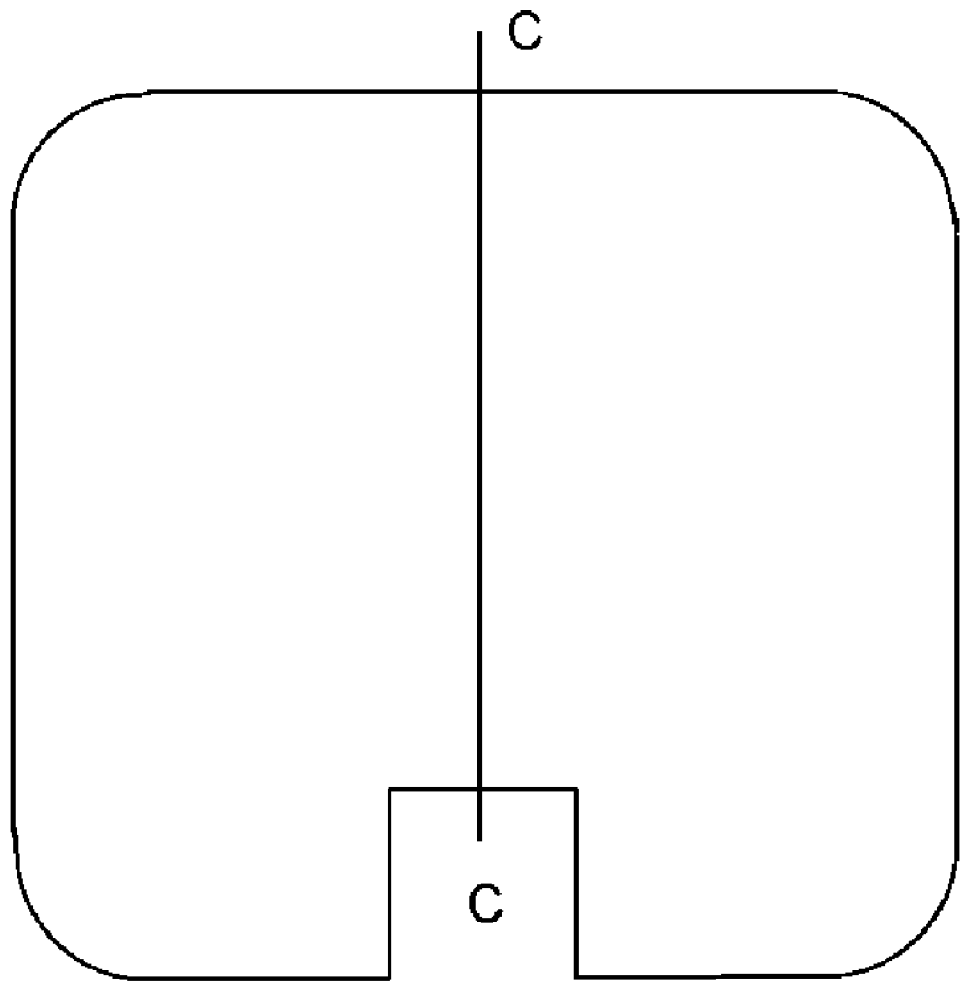
FIG. 1B is a plan of a Tetra Ethyl Oxide Silicate (TEOS) pattern showing a method for manufacturing a semiconductor device according to the invention.
Figure 3:
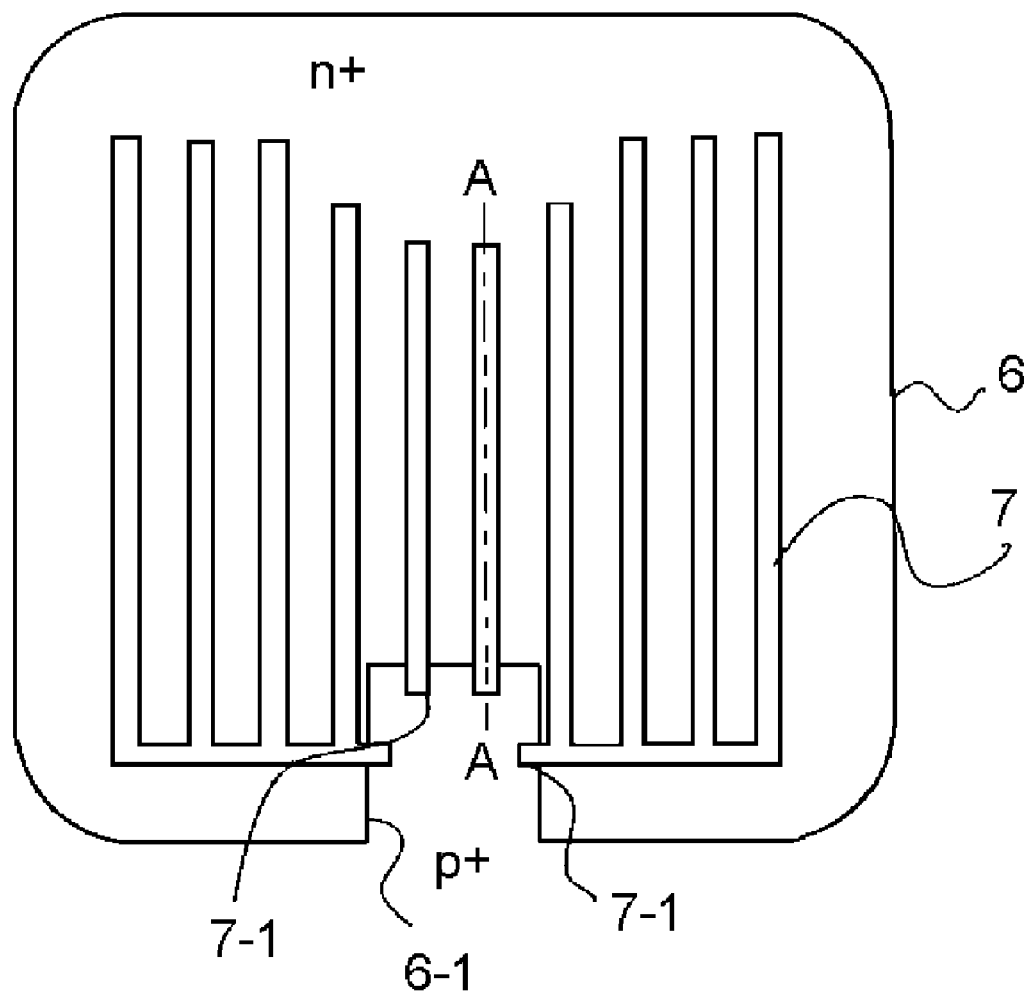
FIG. 3 is a plan of a trench pattern according to a first embodiment of the invention.
Figure 4A:
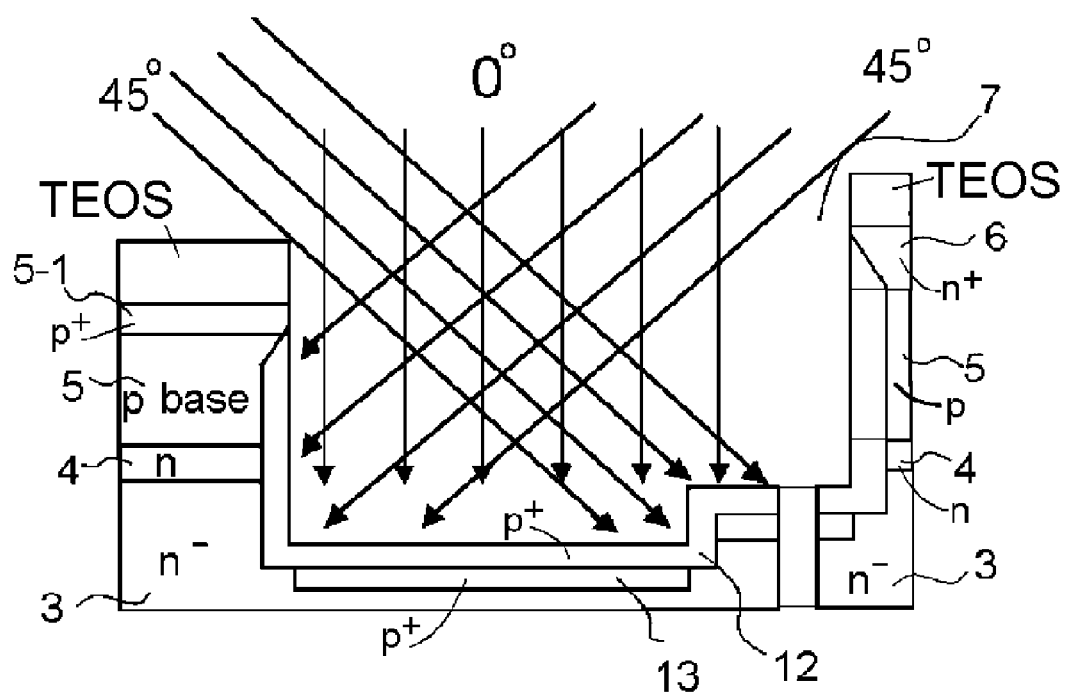
FIG. 4A is a cross-sectional view of a semiconductor substrate showing perpendicularity and tilt ion implantations according to the first embodiment of the invention.

FIGS. 1A-1D and FIG. 2, except for FIG. 1B, are cross-sectional views of semiconductor substrates showing a method for manufacturing a semiconductor device according to the invention. FIG. 1B is a plan of a Tetra Ethyl Oxide Silicate (TEOS) pattern showing the method for manufacturing the semiconductor device according to the invention. FIG. 3 is a plan of a trench pattern according to a first embodiment of the invention. FIG. 4A is a cross-sectional view of the semiconductor substrate showing perpendicularity and tilt ion implantations according to the first embodiment of the invention.

Figure 4B:
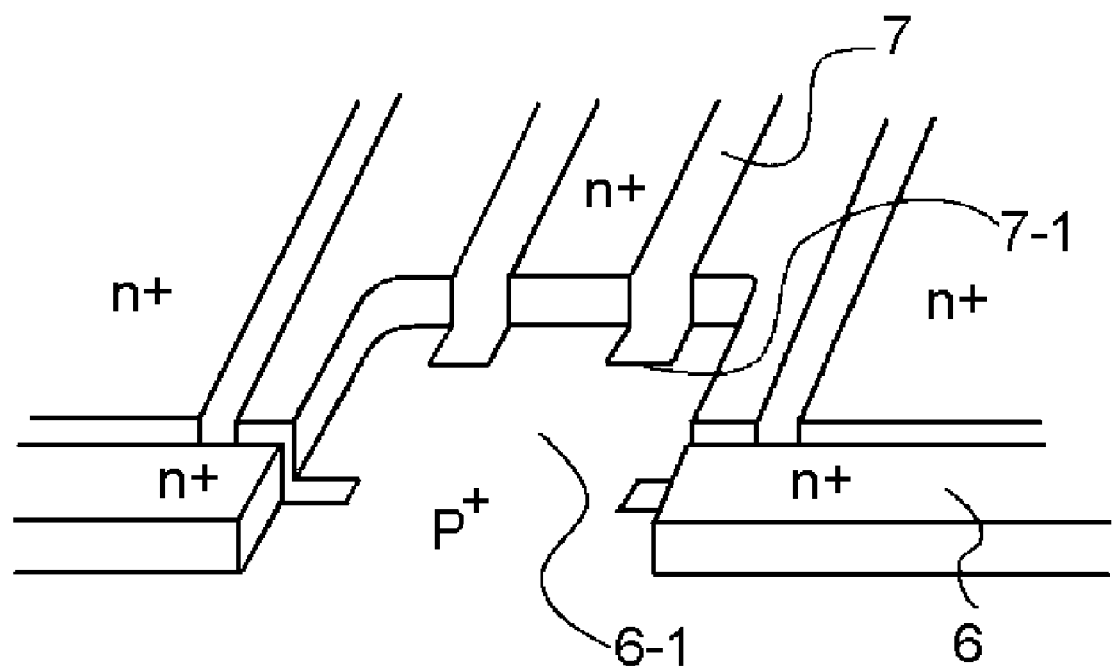
FIG. 4B is an enlarged perspective view of a notch region of an $n^+$ source layer in a semiconductor substrate according to the first embodiment of the invention.
Figure 5:
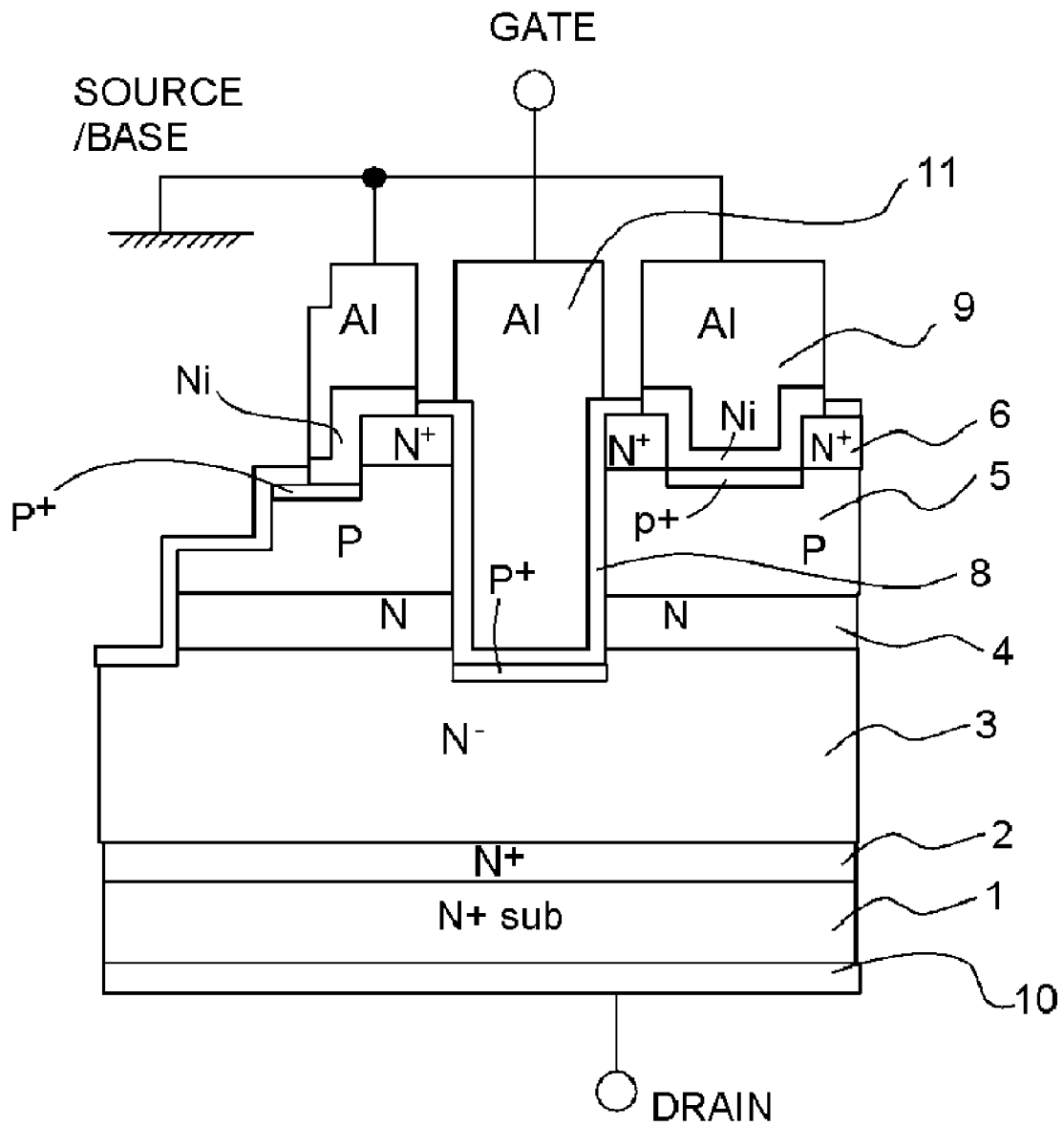
FIG. 5 is a cross-sectional view of a semiconductor substrate of a vertical trench U-shape Metal Oxide Semiconductor Field Effect Transistor (a UMOSFET) according to a second embodiment of the invention.
Figure 6:
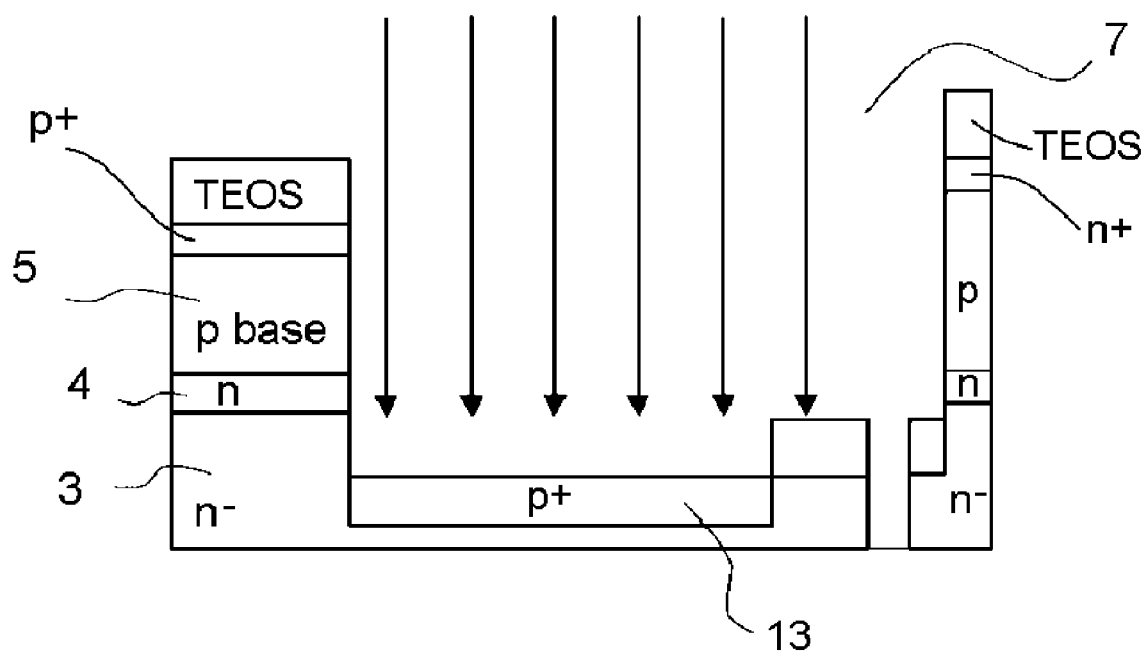
FIG. 6 is a cross-sectional view of a semiconductor substrate showing a direction of radiation of an ion implantation according to the second embodiment of the invention.
Figure 7:
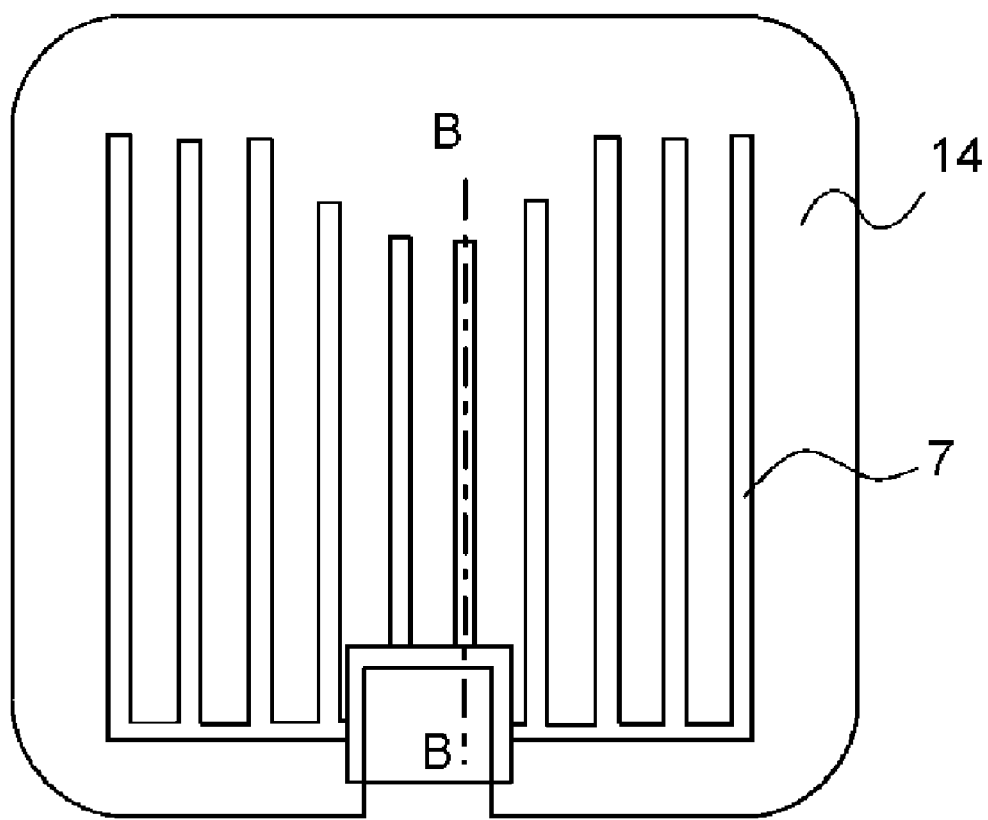
FIG. 7 is a plan showing a TaC film pattern according to the second embodiment of the invention.
Figure 8:
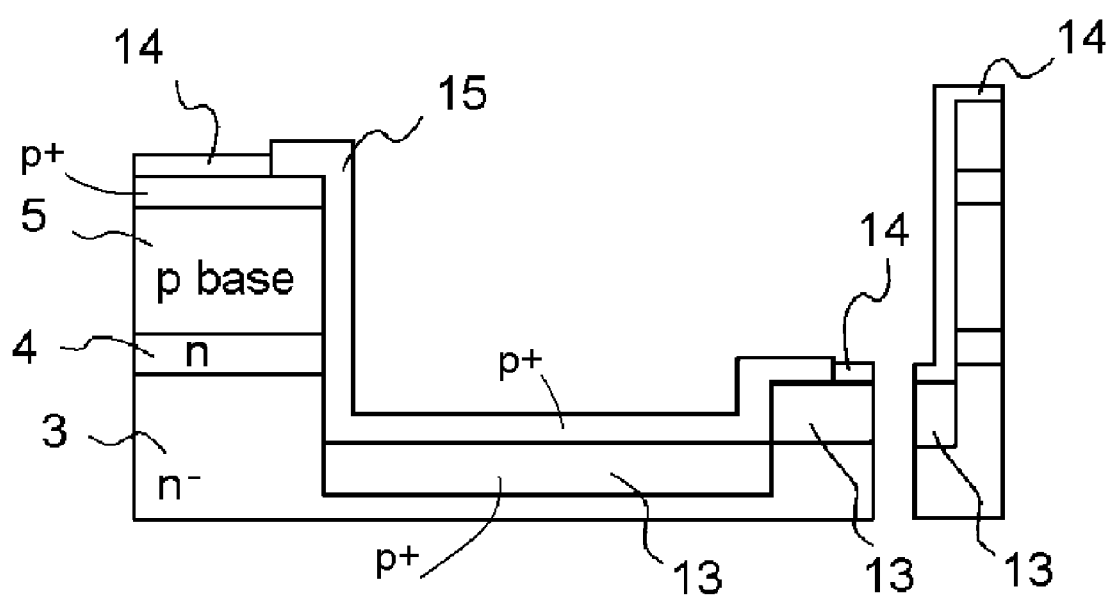
FIG. 8 is a cross-sectional view of a semiconductor substrate according to the second embodiment of the invention.
Figure 9:
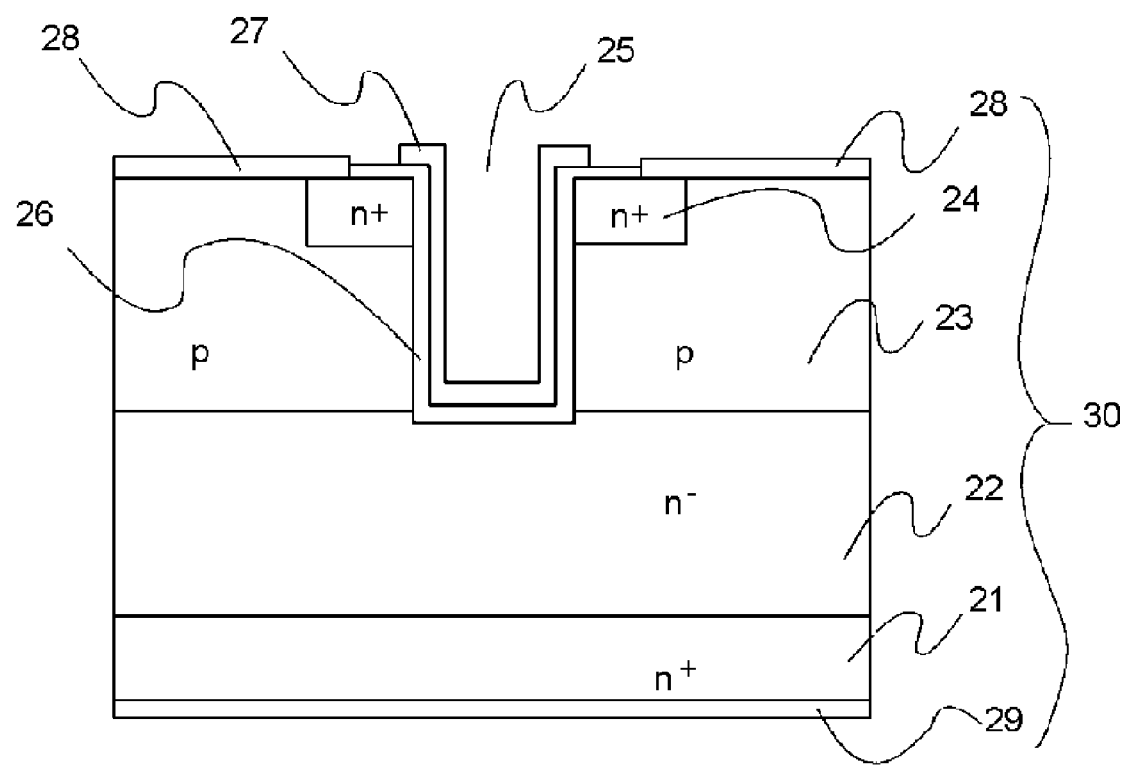
FIG. 9 is a cross-sectional view of a unit cell of a conventional and generic UMOSFET.
Figure 10:
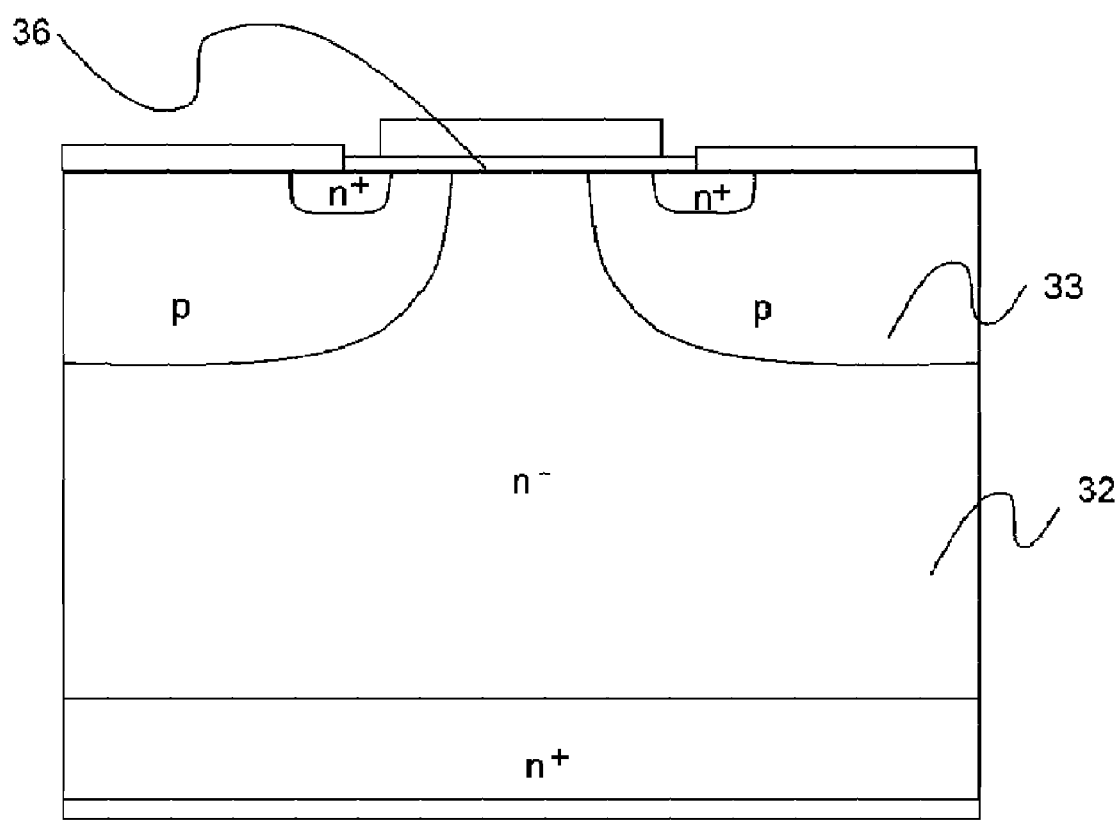
FIG. 10 is a cross-sectional view of a conventional and generic MOSFET.
Figure 11:
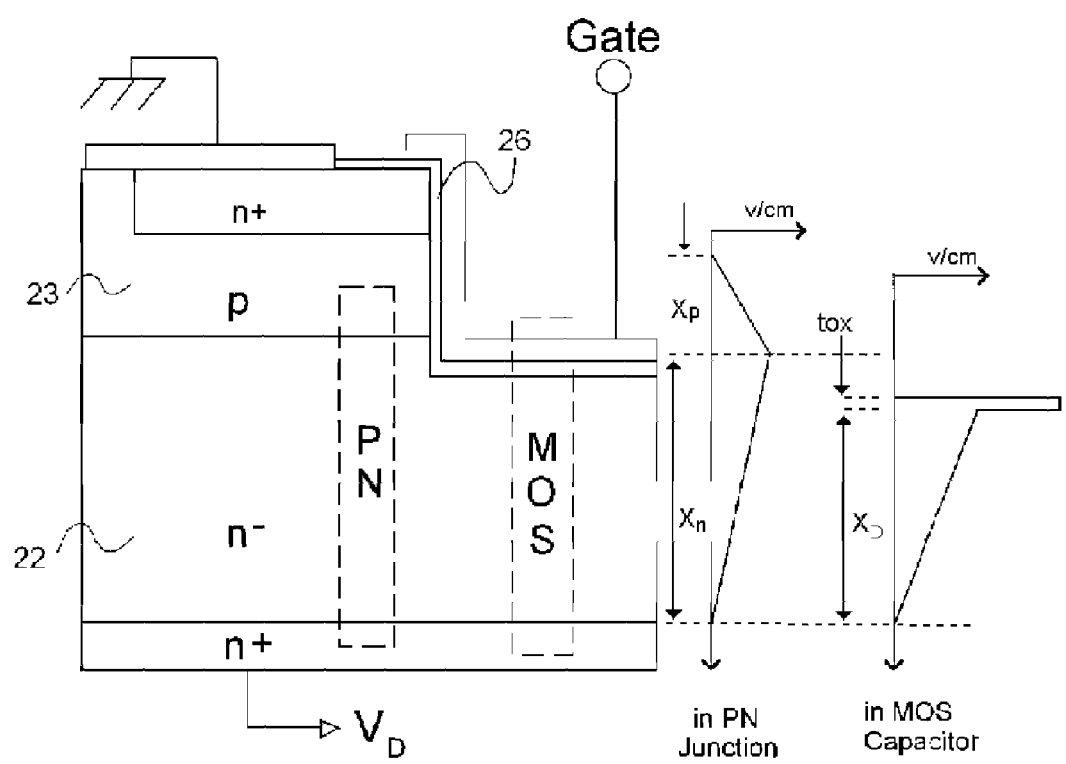
FIG. 11 shows electric field strength distribution diagrams of a conventional and generic UMOSFET.
Figure 12:
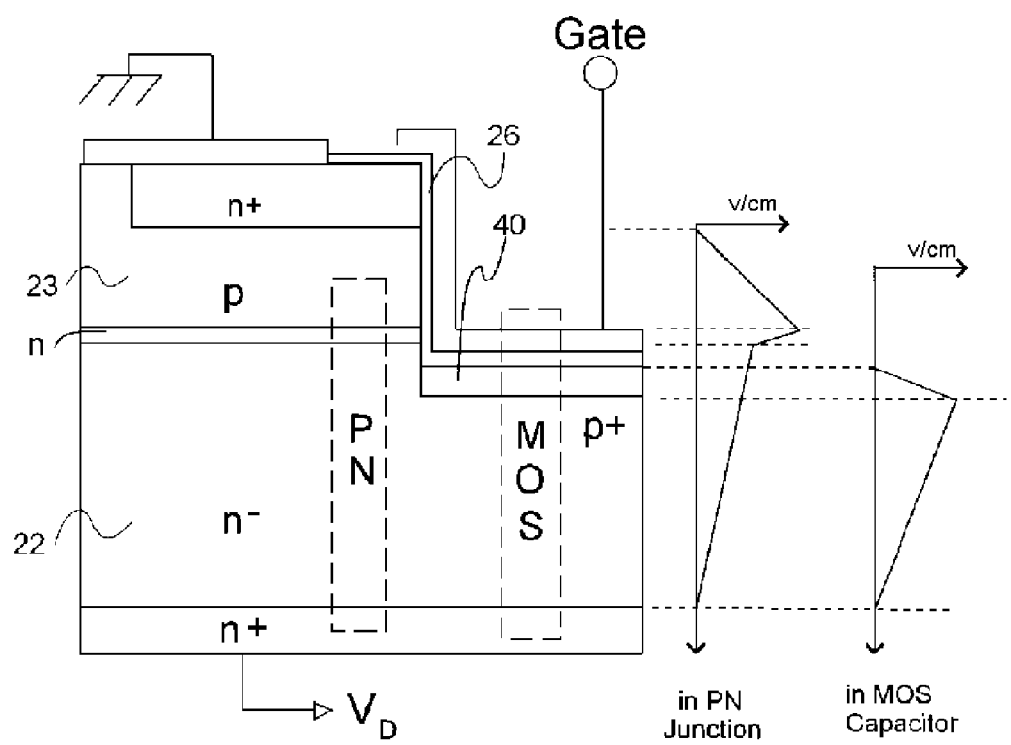
FIG. 12 shows electric field strength distribution diagrams of a conventional UMOSFET.

FIG. 4B is an enlarged perspective view of a notch region of an $n^+$ source layer in the semiconductor substrate according to the first embodiment of the invention. FIG. 5 is a cross-sectional view of the semiconductor substrate of a vertical trench U-shape Metal Oxide Semiconductor Field Effect Transistor (a UMOSFET) according to a second embodiment of the invention. FIG. 6 is a cross-sectional view of the semiconductor substrate showing a direction of radiation of an ion implantation according to the second embodiment of the invention. FIG. 7 is a plan showing a tantalum carbide (TaC) film pattern according to the second embodiment of the invention. FIG. 8 is a cross-sectional view of the semiconductor substrate according to the second embodiment of the invention.

First Embodiment

A method for manufacturing of a trench MOS type silicon carbide semiconductor device according to the invention will be described in detail with reference to the attached drawings. The invention is not limited by description of the embodiments that are explained as follows.

Figure 1C:
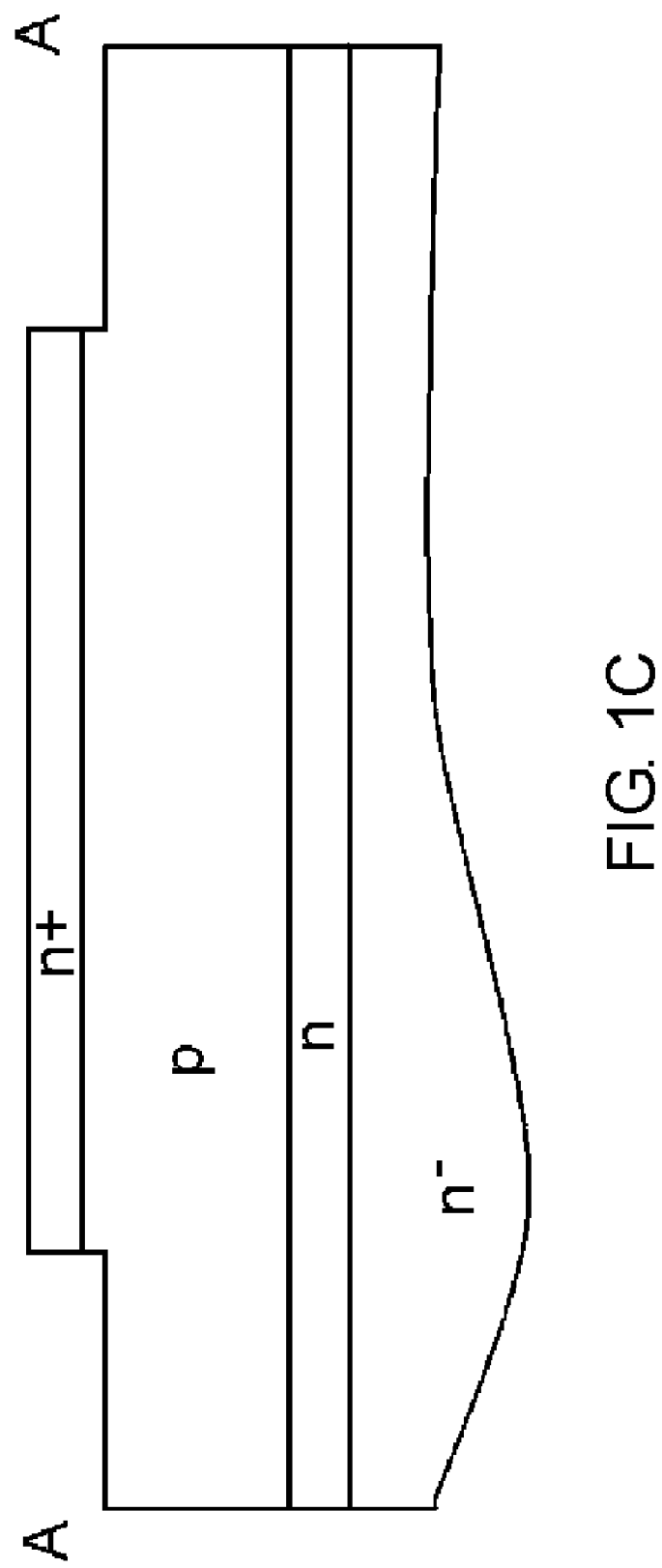
FIG. 1C is a cross-sectional view of a semiconductor substrate showing a method for manufacturing the semiconductor device according to the invention.
Figure 1D:
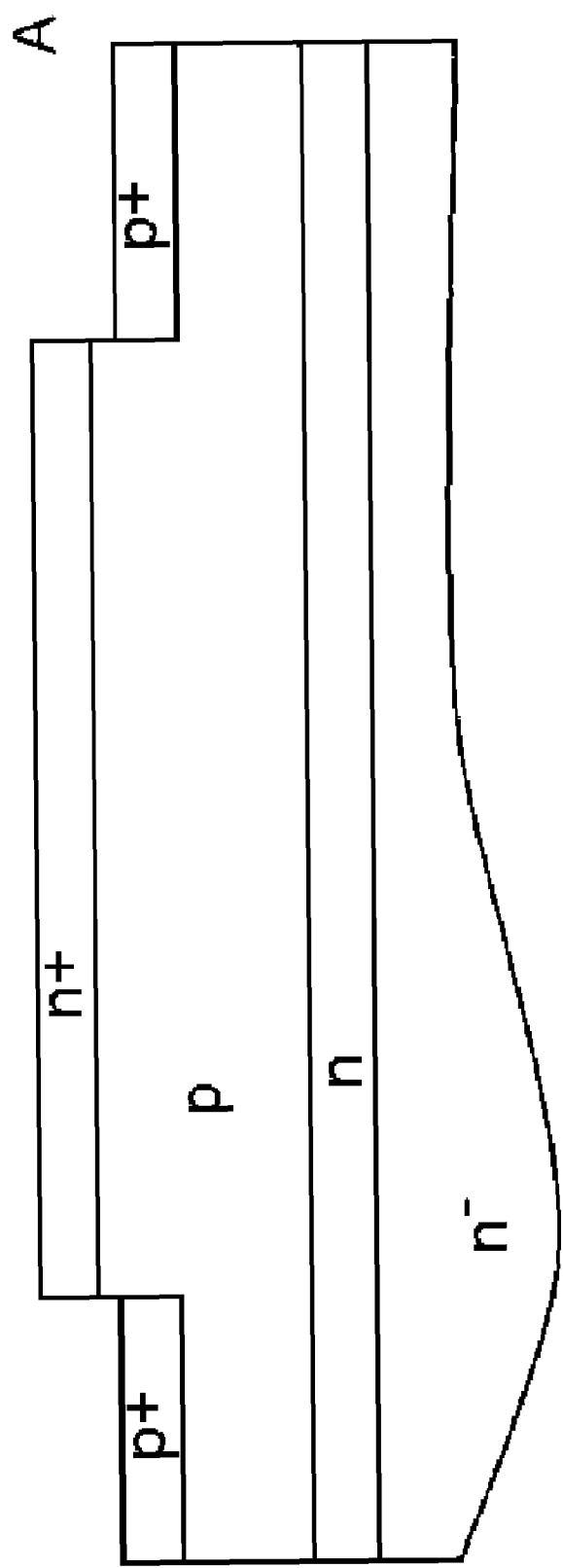
FIG. 1D is a cross-sectional view of a semiconductor substrate showing a method for manufacturing the semiconductor device according to the invention.

A laminated epitaxial wafer is prepared as shown in FIG. 1A. The laminated epitaxial wafer comprises a low-resistance n-type 4H—SiC substrate 1 having a thickness of about 400 μm and an impurity concentration of $1\times10^{18}$ cm$^{-3}$ and main layers formed sequentially on the substrate 1 by epitaxial SiC growth: an n$^+$-type buffer layer 2 having a film thickness of 0.5 μm and an impurity concentration of $1\times10^{18}$ cm$^{-3}$, an n-type drift layer 3 having a film thickness of 10 μm and an impurity concentration of $1\times10^{16}$ cm$^{-3}$, an n-type current-spreading layer 4 having a film thickness of 0.4 μm and an impurity concentration of $1\times10^{17}$ cm$^{-3}$, a p-type layer 5 having a film thickness of 1 μm and an impurity concentration of $1\times10^{17}$ cm$^{-3}$, and an n$^+$-type source layer 6 having a film thickness of 0.5 μm and an impurity concentration of $1\times10^{19}$ cm$^{-3}$. Thereafter, a Tetra Ethyl Oxide Silicate (hereinafter referred to as TEOS) oxide film that becomes a mask is deposited on the entire surface, and a TEOS pattern shown in FIG. 1B is formed by using photolithography and buffered hydrofluoric acid (hereinafter referred to as BHF) wet etching. Thereafter, the n$^+$-type source layer 6 is selectively removed by anisotropic etching of reactive ion etching (hereinafter referred to as RIE) to use the TEOS oxide film as a mask, and the p-type base layer 5 is exposed selectively. When all the TEOS oxide film used as the mask has been removed, the n$^+$ source layer 6 remains in the shape of the pattern of FIG. 1B and the p-type base layer 5 is exposed around the layer 6. This state is shown in FIG. 1C. FIG. 1C is a cross-sectional view along the line segment C-C of FIG. 1B. In this state, ions of aluminum that is an element of p conductivity type are implanted into the entire surface of the SiC substrate. An impurity concentration and a depth of a p$^+$ region 5-1 are respectively $1\times10^{18}$ cm$^{-3}$ and 0.3 μm after the ion implantation and activation. This state is shown in FIG. 1D as a cross-sectional view along the line segment C-C of FIG. 1B.

Figure 2:
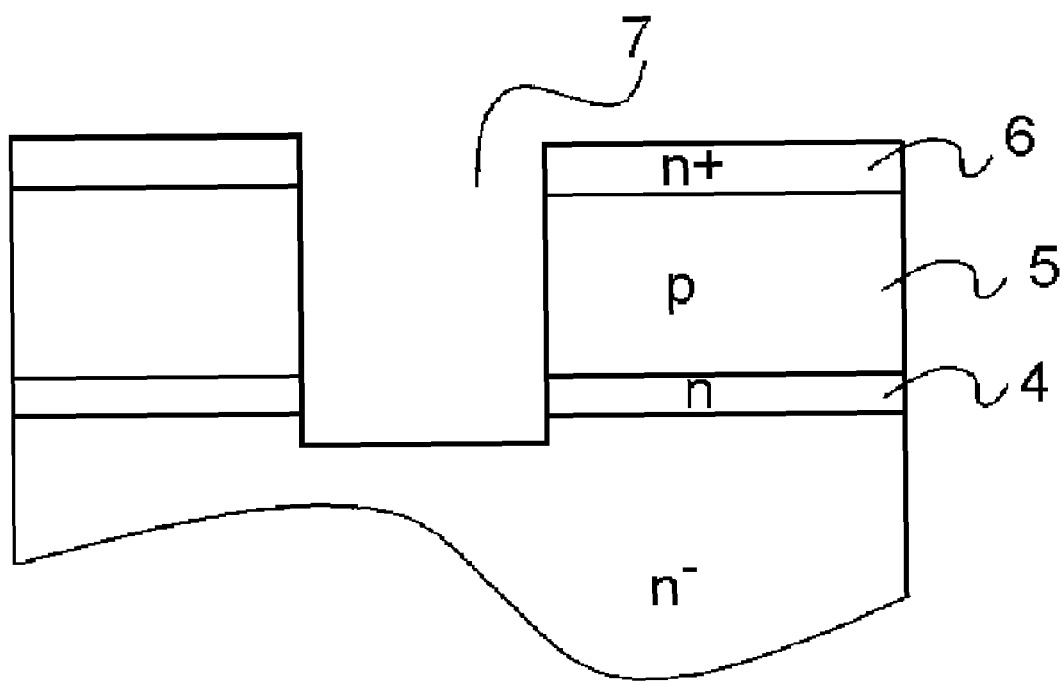
FIG. 2 is a cross-sectional view of a semiconductor substrate showing a method for manufacturing the semiconductor device according to the invention.

Further, as shown in FIG. 2, a trench 7 is formed perpendicular to a principal surface on the side of the n$^+$-type source layer 6 by RIE using a silicon oxide film (TEOS oxide film) as a mask. A depth of the bottom of the trench is deeper than at least the lower end of the current-spreading layer 4 as shown in FIG. 2. At this time, the pattern shape of the trench 7 formed on the surface of the n$^+$-type source layer 6 is shown in a plan view in FIG. 3. Thereafter, aluminum ions that become the p conductivity type are implanted in the directions of radiation indicated by the arrowed lines of FIG. 4A into the principal surface of the wafer in which the stripe shaped trench 7 is formed. FIG. 4A is a partially cross-sectional view omitting a central portion when the wafer is cut along a longitudinal direction of the trench center that is indicated by the line segment A-A in the plan view of FIG. 3. As shown by the arrowed lines of FIG. 4A, in a preferred embodiment a perpendicular ion implantation and tilt ion implantations at ±45° are carried out three times in total to the laminated epitaxial wafer in which the trench 7 is formed by the surface pattern shown in FIG. 3. The tilt ion implantations are shown by the inclined arrowed lines showing the ion implantation directions without inclining the wafer in FIG. 4A for descriptive purposes. A lower portion of the trench bottom that has a difference in level as shown in FIG. 4A corresponds to a portion of the trench in a notch region 6-1 of the n$^+$ source layer 6 as shown in FIG. 3. FIG. 4B is a perspective view showing that a first end of the trench 7 is formed in the notch region 6-1. At this time, the orientation of the wafer is inclined about a rotation axis perpendicular to a longitudinal direction of the stripe shaped trench. Whereby, as described above, the ions are implanted into only the across-the-width side walls of the first and second ends of the trench, the trench bottom p$^+$ layer 13, and side walls 7-1 (indicated as the heavy line segments in FIG. 4A) of the first end of the trench 7 in the notch region 6-1 of the n$^+$ source layer 6, but the ions are not implanted into any other area except that of the trench pattern due to a mask of TEOS oxide film and also the ions are not implanted into the side walls on the longer sides of the trench, which occupy the largest part of the area of the side walls (and including particularly the region in which a channel (inversion layer) is formed). As a result, the gate threshold voltage is hardly changed and mobility is hardly affected. Because the ions are implanted into the across-the-width side walls of the first and second ends of the stripe shaped trench of FIG. 3 and the trench bottom p$^+$ layer 13, the trench bottom p$^+$ layer 13 and a p$^+$ region 5-1 in the surface are electrically coupled by this implanted portion. In other words, it is not necessary to newly provide an electrode film pad electrically connected to the trench bottom p$^+$ SiC layer 13 in contrast with the conventional method, because the p$^+$ region 12 formed on the across-the-width side walls of the first and second ends of the trench by this ion implantation allows the trench bottom p$^+$ layer 13, the p base region 5 and the source electrode 9 on the side of the principal surface to electrically couple with one another. Thereafter, the implanted aluminum ions are activated electrically by annealing at a high temperature. Subsequently, a gate oxide film 8, a source electrode 9, a drain electrode 10 and a gate electrode 11 are formed sequentially and the UMOSFET is completed as shown in FIG. 5.

A Second Embodiment

A method for manufacturing a SiC semiconductor device according to a second embodiment is the same as that of the first embodiment until the process of FIG. 2 where the trench is formed. Thereafter, the ion implantation of aluminum is carried out by irradiation in only a direction perpendicular to the principal surface of the SiC wafer as shown in FIG. 6 but a tilt ion implantation of aluminum ions inclining the SiC wafer is not carried out. FIG. 6 is the cross-sectional view of the trench that is cut longitudinally along the line segment B-B of a plan view shown in FIG. 7. The p$^+$ SiC layer 13 is formed only on the bottom of the trench by this vertical incidence ion implantation. Thereafter, tantalum (Ta) metal is sputtered on the entire surface of the principal surface of the SiC wafer, and then a TaC layer 14 is formed on the entire surface of the wafer by annealing in propane ($C_3H_8$). Further an aperture is opened in the TaC layer 14 of the portion corresponding to the surface pattern 7 of the trench by photolithography and removed by BHF wet etching as shown in FIG. 7, and thus the trench bottom p$^+$ SiC layer 13 is exposed. Subsequently, when a p$^+$ epitaxial SiC region 15 is formed by a p$^+$ epitaxial SiC growth, the p$^+$ epitaxial SiC region 15 is selectively grown on the bottom of the trench and on the across-the-width side walls of the first end of the trench as shown in FIG. 8 because SiC is not grown epitaxially on a TaC layer 14. This selectively grown p$^+$ epitaxial SiC region 15 allows the trench bottom p$^+$ layer 13 and the p base region 5 to couple electrically to one another.

Thereafter, as in the case of the first embodiment, the implanted aluminum ions are activated electrically by annealing at a high temperature. Further, a gate oxide film 8, a source electrode 9, a drain electrode 10 and a gate electrode 11 are formed sequentially and the UMOSFET is completed as shown in FIG. 5.

The on-resistance can be reduced in the SiC-UMOSFET having the structure explained in the first and second embodiments because it is not necessary to newly provide an electrode film pad electrically connected to the $p^+$ layer of the bottom of the trench. This advantage becomes remarkable as a current capacity is reduced and as an area of electrodes is reduced. For example, a reduction rate of the on-resistance is 5% in the case of the SiC semiconductor device having a current capacity of 100 A (ampere), and a 20% reduction in the on-resistance has been able to be realized in the case of the SiC semiconductor device having a current capacity of 10 A (ampere). In addition, it has been possible to reduce the number of wire bonding locations from three to two per SiC semiconductor device.

It will be appreciated by those skilled in the art that the invention may be practiced otherwise than as specifically described in the preferred embodiments without departing from the scope thereof.

What is claimed is:

1. A method for manufacturing a trench MOS type SiC semiconductor device, comprising the steps of:

providing a first conductivity type semiconductor substrate, forming a first conductivity type drift layer on the first conductivity type semiconductor substrate, forming a second conductivity type base layer on the first conductivity type drift layer, forming a first conductivity type source layer on the second conductivity type base layer, forming a stripe shaped trench reaching from the surface of the first conductivity type source layer to the first conductivity type drift layer, forming a second conductivity type layer on the bottom of the stripe shaped trench, forming a second conductivity type region on the second conductivity type layer and on across-the-width side walls of at least a first end of the stripe shaped trench, and using the second conductivity type region so as to electrically couple the second conductivity type layer with the second conductivity type base layer, and forming a gate oxide film and then a gate electrode in said trench.

2. The method of manufacturing according to claim 1, wherein the step of forming the second conductivity type region on the second conductivity type layer and on the across-the-width side walls of at least the first end of the stripe shaped trench comprises performing an ion implantation of an ion species so as to electrically couple the second conductivity type layer with the second conductivity type base layer.

3. The method of manufacturing according to claim 2, wherein the ion implantation comprises implanting the ion species in directions of perpendicularity and tilt to a principal surface of the first conductivity type semiconductor substrate.

4. A method for manufacturing a trench MOS type SiC semiconductor device, comprising the steps of:

providing a first conductivity type semiconductor substrate, forming a first conductivity type drift layer on the first conductivity type semiconductor substrate, forming a second conductivity type base layer on the first conductivity type drift layer, forming a first conductivity type source layer on the second conductivity type base layer, forming a stripe shaped trench reaching from the surface of the first conductivity type source layer to the first conductivity type drift layer, forming a second conductivity type layer on the bottom of the stripe shaped trench, forming a TaC film used as a mask for selectively forming a second conductivity type region on the second conductivity type layer and on across-the-width side walls of at least a first end of the stripe shaped trench to electrically couple the second conductivity type layer with the second conductivity type base layer, forming the second conductivity type region on the second conductivity type layer and on the across-the-width side walls of at least the first end of the stripe shaped trench by selectively growing epitaxial SiC to electrically couple the second conductivity type layer with the second conductivity type base layer, and forming a gate oxide film and then a gate electrode in said trench.

* * * * *